United States Patent

Nobori et al.

[11] Patent Number: 5,866,439
[45] Date of Patent: Feb. 2, 1999

[54] METHOD OF FABRICATING AN END FACE LIGHT EMITTING TYPE LIGHT-EMITTING DIODE AND A LIGHT-EMITTING DIODE ARRAY DEVICE

[75] Inventors: Masaharu Nobori; Hiroyuki Fujiwara; Masumi Koizumi; Makoto Ishimaru, all of Tokyo, Japan

[73] Assignee: Oki Electric Industry Co., Ltd., Tokyo, Japan

[21] Appl. No.: 687,046

[22] Filed: Jul. 18, 1996

[30] Foreign Application Priority Data

Jul. 21, 1995 [JP] Japan ............................... 7-186085

[51] Int. Cl.⁶ ................................................ H01L 21/383
[52] U.S. Cl. ............................................................. 438/22
[58] Field of Search ................................. 438/22, 28, 45, 438/23

[56] References Cited

U.S. PATENT DOCUMENTS 4,912,533  3/1990  Takahashi ................................. 357/17
5,357,123  10/1994  Sugawara ................................. 257/88

FOREIGN PATENT DOCUMENTS 2-125765  5/1990  Japan .
5-031955  2/1993  Japan .

*Primary Examiner*—Chandra Chaudhari
*Assistant Examiner*—Craig Thompson
*Attorney, Agent, or Firm*—Jones & Volentine, L.L.P.

[57] ABSTRACT

In a fabricating method for an end face light emitting type LED array, p-type regions are formed by diffusing impurities into portions of a semiconductor substrate, using a diffusion prevention film as a mask. Subsequently, using the diffusion prevention film as a mask again, the semiconductor substrate is etched to form a concave portion therein so that light-emission end faces are formed on a side of the concave portion. With this arrangement, a positional misalignment between the p-type regions and the light-emission end faces is prevented.

14 Claims, 11 Drawing Sheets

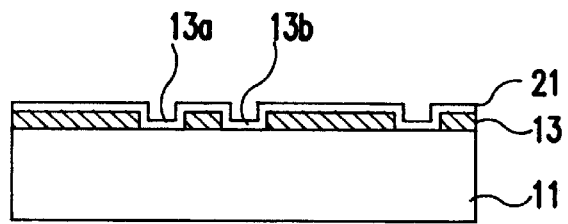
FIG.4A
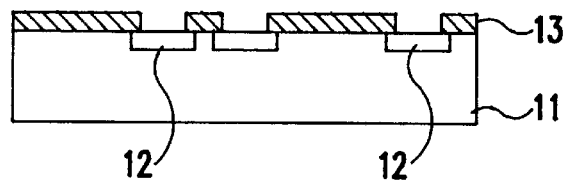
FIG.4B
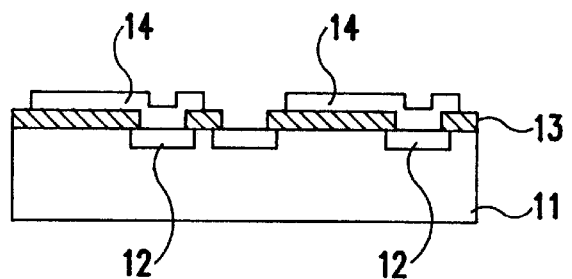
FIG.4C
ETCHING MASK FORMING
PROCESS OMITTED
FIG.4D

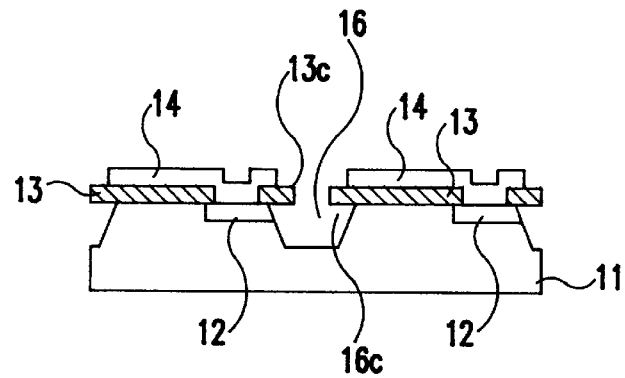
FIG.4E
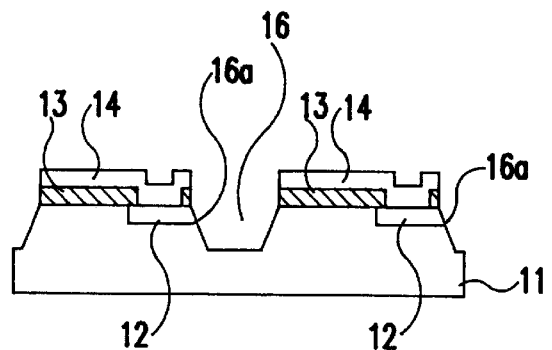
FIG.4F
ETCHING MASK REMOVING
PROCESS OMITTED
FIG.4G

METHOD OF FABRICATING AN END FACE LIGHT EMITTING TYPE LIGHT-EMITTING DIODE AND A LIGHT-EMITTING DIODE ARRAY DEVICE

BACKGROUND OF THE INVENTION

1. Field of the Invention

The present invention relates to a method of fabricating an end face light emitting type LED (light-emitting diode), one type of LED's to be used, for example, in an electrophotographic printer as a light source and in others, and further relates to a light-emitting diode array device including an array of the end face light emitting type LED's.

2. Description of the Prior Art

LED's have been widely used in the form of LED arrays each including a plurality of the LED's. One type of these LED arrays is called an end face light emitting type LED array. Structures and fabricating methods of the end face light emitting type LED arrays are disclosed, for example, in Japanese First (unexamined) Patent Publications Nos. 2-125765 and 5-31955.

The former publication discloses a method, wherein a semiconductor wafer in the laminated form of an n-side electrode, an n-type GaAs buffer layer, an n-type AlGaAs layer, a p-type AlGaAs region and a p-side electrode is diced into a plurality of end face light emitting type LED arrays. In the end face light emitting type LED array of this type, by applying the forward voltage across an pn junction between the p-type AlGaAs region and the n-type AlGaAs layer to allow the current to flow therethrough, the electric energy can be directly converted into light.

The latter publication discloses a method, wherein light-emission end faces are formed on a semiconductor wafer having a double hetero structure by means of the dry etching using chlorine gas.

However, in the conventional end face light emitting type LED array fabricating methods, there have been the following problems:

In each of the former and latter fabricating methods, when forming the light-emission end faces after the formation of the p-type regions working as light-emission layers, the light-emission end faces are formed in a manner which has no close relationship with the formation of the p-type regions. Specifically, the light-emission end faces are formed by dicing the semiconductor wafer into the LED arrays using a dicing machine with a high-speed rotating diamond blade, or the light-emission end faces are formed on a side of a concave portion which is formed by etching end portions of the LED's using the photolithography and dry etching techniques.

In these conventional fabricating methods, a positional misalignment of the light-emission end faces may occur due to insufficient alignment accuracy during the dicing process and insufficient accuracy of the dicing device or due to misalignment of masks in the photolithography. If such a positional misalignment of the light-emission end faces occurs, sizes of the p-type regions in a plan view of the semiconductor wafer are subjected to change. Thus, for achieving uniform emitted-light quantities, it is necessary to feed the current in proportion to sizes of the p-type regions. Accordingly, particularly in case of a constant-current driven type LED, since the supplied current is constant, unevenness in emitted-light quantity is caused.

SUMMARY OF THE INVENTION

Therefore, it is an object of the present invention to provide an improved method of fabricating an end face light emitting type light-emitting diode.

It is another object of the present invention to provide a light-emitting diode array device including an array of end face light emitting type light-emitting diodes fabricated according to the improved method.

According to one aspect of the present invention, a method of fabricating an end face light emitting type light-emitting diode, comprises a light-emitting portion forming process for diffusing an impurity of a second conductive type into a semiconductor substrate of a first conductive type so as to form a region of the second conductive type, and forming a light-emitting portion having a pn junction formed by the second conductive type region and the semiconductor substrate; and an electrode forming process for forming a first electrode on the semiconductor substrate so as to be connected to the second conductive type region, and forming a second electrode on an underside of the semiconductor substrate, wherein the light-emitting portion forming process comprises a diffusion prevention film forming process for forming an insulation film on the semiconductor substrate, and removing an impurity diffusion scheduled region and an adjacent concave portion forming scheduled region from the insulation film so as to form a patterned diffusion prevention film; a second conductive type region forming process for diffusing the second conductive type impurity into a portion of the semiconductor substrate which is non-covered by the diffusion prevention film, using the diffusion prevention film as a mask, so as to form the second conductive type region; and a light-emission end face forming process for etching the semiconductor substrate through the concave portion forming scheduled region of the diffusion prevention film so as to form a concave portion therein, the concave portion having a depth exceeding the pn junction, and forming a light-emission end face of the light-emitting portion on a side of the concave portion.

According to another aspect of the present invention, a method of fabricating an end face light emitting type light-emitting diode, comprises a diffusion prevention film forming process for forming an insulation film on a semiconductor substrate of a first conductive type, and removing an impurity diffusion scheduled region and an adjacent concave portion forming scheduled region from the insulation film so as to form a patterned diffusion prevention film; a second conductive type region forming process for diffusing an impurity of a second conductive type into a portion of the semiconductor substrate which is non-covered by the diffusion prevention film, using the diffusion prevention film as a mask, so as to form a region of a second conductive type; a first electrode forming process for forming a first electrode on the diffusion prevention film so as to be connected to the second conductive type region; a light-emission end face forming process for etching the semiconductor substrate using the diffusion prevention film and the first electrode as masks so as to form a concave portion therein, the concave portion having a depth exceeding a pn junction formed by the second conductive type region and the semiconductor substrate, and forming a light-emission end face of the pn junction on a side of the concave portion; an eaves portion removing process for removing an eaves portion of the diffusion prevention film by etching, using the first electrode as a mask; and a second electrode forming process for forming a second electrode on an underside of the semiconductor substrate in a desired process after the first electrode forming process.

According to another aspect of the present invention, a method of fabricating an end face light emitting type light-emitting diode, comprises a diffusion prevention film forming process for forming an insulation film on a semiconductor substrate of a first conductive type, and removing an impurity diffusion scheduled region and an adjacent concave portion forming scheduled region from the insulation film so as to form a patterned diffusion prevention film; a diffusion control film forming process for forming a diffusion control film which covers the diffusion prevention film, the impurity diffusion scheduled region and the concave portion forming scheduled region; a second conductive type region forming process for diffusing, through the diffusion control film, an impurity of a second conductive type into a portion of the semiconductor substrate which is non-covered by the diffusion prevention film, using the diffusion prevention film as a mask, so as to form a region of a second conductive type; a first electrode forming process for forming, after removing the diffusion control film, a first electrode on the diffusion prevention film so as to be connected to the second conductive type region; a light-emission end face forming process for etching the semiconductor substrate using the diffusion prevention film as a mask so as to form a concave portion therein, the concave portion having a depth exceeding a pn junction formed by the second conductive type region and the semiconductor substrate, and forming a light-emission end face of the pn junction on a side of the concave portion; an eaves portion removing process for removing an eaves portion of the diffusion prevention film by etching, using the first electrode as a mask; a second electrode forming process for forming a second electrode on an underside of the semiconductor substrate in a desired process after the first electrode forming process; and a dicing process for cutting the concave portion of the semiconductor substrate.

According to another aspect of the present invention, a method of fabricating an end face light emitting type light-emitting diode, comprises a diffusion prevention film forming process for forming an insulation film on a semiconductor substrate of a first conductive type, and removing an impurity diffusion scheduled region and an adjacent concave portion forming scheduled region from the insulation film so as to form a patterned diffusion prevention film; a second conductive type region forming process for diffusing an impurity of a second conductive type into a portion of the semiconductor substrate which is non-covered by the diffusion prevention film, using the diffusion prevention film as a mask, so as to form a region of a second conductive type; a first electrode forming process for forming a first electrode on the diffusion prevention film so as to be connected to the second conductive type region; an etching mask forming process for forming an etching mask film on the diffusion prevention film and the first electrode for assisting concave portion formation, the etching mask film covering a portion other than the concave portion forming scheduled region, so as to prevent the portion covered by the etching mask film from being etched upon removing an eaves portion in a later process; a light-emission end face forming process for etching the semiconductor substrate using the diffusion prevention film and the etching mask film as masks so as to form a concave portion therein, the concave portion having a depth exceeding a pn junction formed by the second conductive type region and the semiconductor substrate, and forming a light-emission end face of the pn junction on a side of the concave portion; an eaves portion removing process for removing an eaves portion of the diffusion prevention film by etching, using the etching mask film as a mask, and then removing the etching mask film; a second electrode forming process for forming a second electrode on an underside of the semiconductor substrate in a desired process after the first electrode forming process; and a dicing process for cutting the concave portion of the semiconductor substrate.

According to another aspect of the present invention, a method of fabricating an end face light emitting type light-emitting diode, comprises a diffusion prevention film forming process for forming an insulation film on a semiconductor substrate of a first conductive type, and removing an impurity diffusion scheduled region and an adjacent concave portion forming scheduled region from the insulation film so as to form a patterned diffusion prevention film; a second conductive type region forming process for diffusing an impurity of a second conductive type into a portion of the semiconductor substrate which is non-covered by the diffusion prevention film, using the diffusion prevention film as a mask, so as to form a region of a second conductive type; an etching mask forming process for forming an etching mask film on the diffusion prevention film for assisting concave portion formation, the etching mask film covering a portion other than the concave portion forming scheduled region, so as to prevent the portion covered by the etching mask film from being etched upon removing an eaves portion in a later process; a light-emission end face forming process for etching the semiconductor substrate using the diffusion prevention film and the etching mask film as masks so as to form a concave portion therein, the concave portion having a depth exceeding a pn junction formed by the second conductive type region and the semiconductor substrate, and forming a light-emission end face of the pn junction on a side of the concave portion; an eaves portion removing process for removing an eaves portion of the diffusion prevention film by etching, using the etching mask film as a mask, and then removing the etching mask film; a first electrode forming process for forming a first electrode on the diffusion prevention film so as to be connected to the second conductive type region; a second electrode forming process for forming a second electrode on an underside of the semiconductor substrate in a desired process after the etching mask forming process; and a dicing process for cutting the concave portion of the semiconductor substrate.

According to another aspect of the present invention, a method of fabricating an end face light emitting type light-emitting diode, comprises a diffusion prevention film forming process for forming an insulation film on a semiconductor substrate of a first conductive type, and removing an impurity diffusion scheduled region and an adjacent concave portion forming scheduled region from the insulation film so as to form a patterned diffusion prevention film; a diffusion control film forming process for forming a diffusion control film which covers the diffusion prevention film, the impurity diffusion scheduled region and the concave portion forming scheduled region; a second conductive type region forming process for diffusing, through the diffusion control film, an impurity of a second conductive type into a portion of the semiconductor substrate which is non-covered by the diffusion prevention film, using the diffusion prevention film as a mask, so as to form a region of a second conductive type; an etching mask forming process for forming an etching mask film on the diffusion prevention film for assisting concave portion formation, the etching mask film covering a portion other than the concave portion forming scheduled region, so as to prevent the portion covered by the etching mask film from being etched upon removing an eaves portion in a later process; a light-emission end face forming process for etching the semiconductor substrate using the diffusion prevention film and the etching mask film as masks so as to form a concave portion therein, the concave portion having a depth exceeding a pn junction formed by the second conductive type region and the semiconductor substrate, and forming a light-emission end face of the pn junction on a side of the concave portion; an eaves portion removing process for removing an eaves portion of the diffusion prevention film by etching, using the etching mask film as a mask, and then removing the etching mask film; a first electrode forming process for forming a first electrode on the diffusion prevention film so as to be connected to the second conductive type region; a second electrode forming process for forming a second electrode on an underside of the semiconductor substrate in a desired process after the etching mask forming process; and a dicing process for cutting the concave portion of the semiconductor substrate.

It may be arranged that the first conductive type is an n-type and the second conductive type is a p-type.

It may be arranged that an end face light emitting type light-emitting diode array device comprises an array of diodes each fabricated according to any one of the foregoing methods, and that the semiconductor substrates of all the diodes are common with each other.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings. Throughout the figures showing the preferred embodiments, the same signs or symbols represent the same or like components.

[First Embodiment]

Figure 1A:
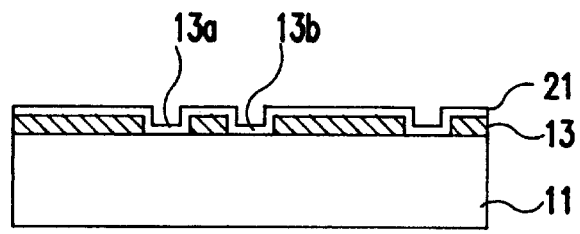
FIG. 1 is a diagram for explaining a method of fabricating end face light emitting type LED arrays according to a first preferred embodiment of the present invention.
Figure 1B:
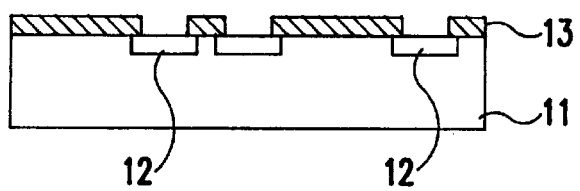
Figure 1C:
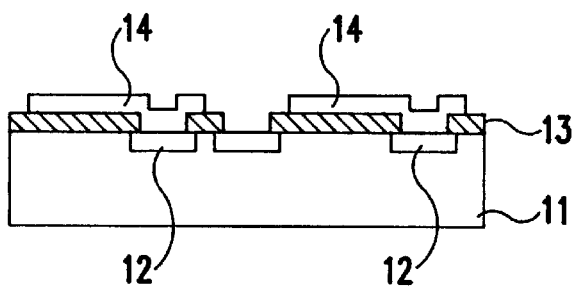
Figure 1D:
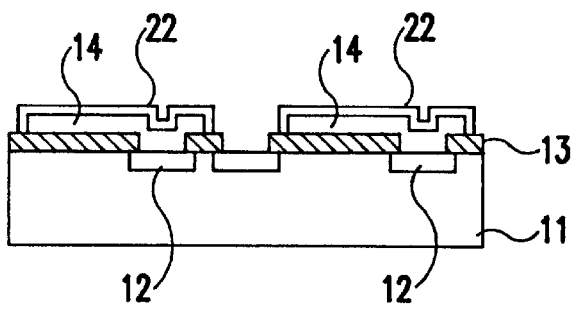
Figure 1E:
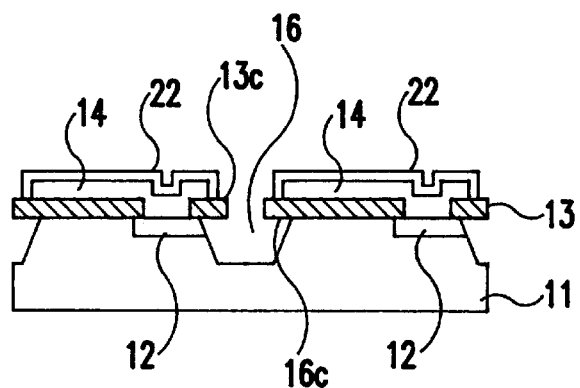
Figure 1F:
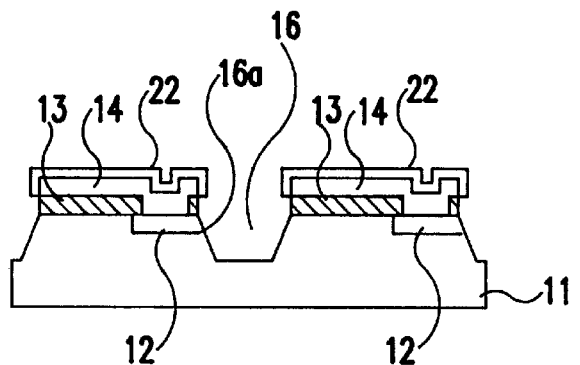
Figure 1G:
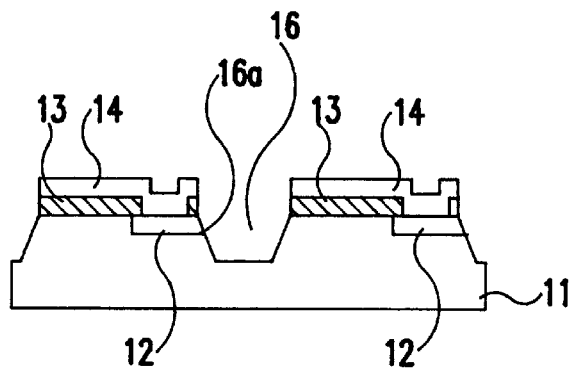
Figure 1H:
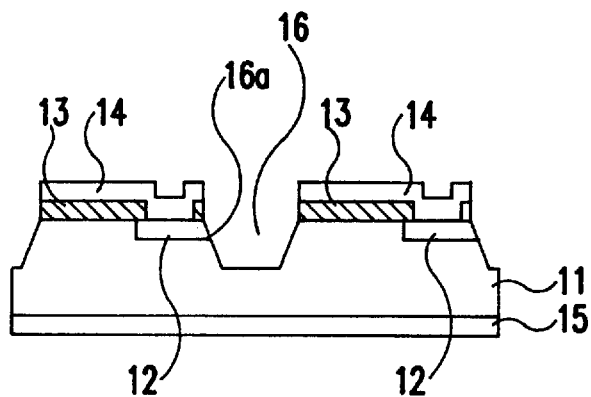
Figure 1I:
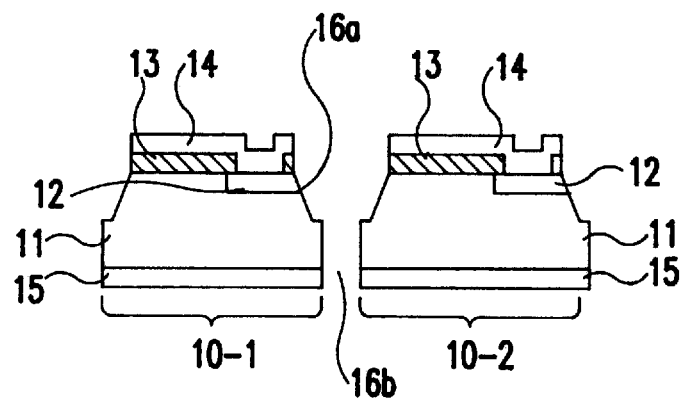
Figure 2A:
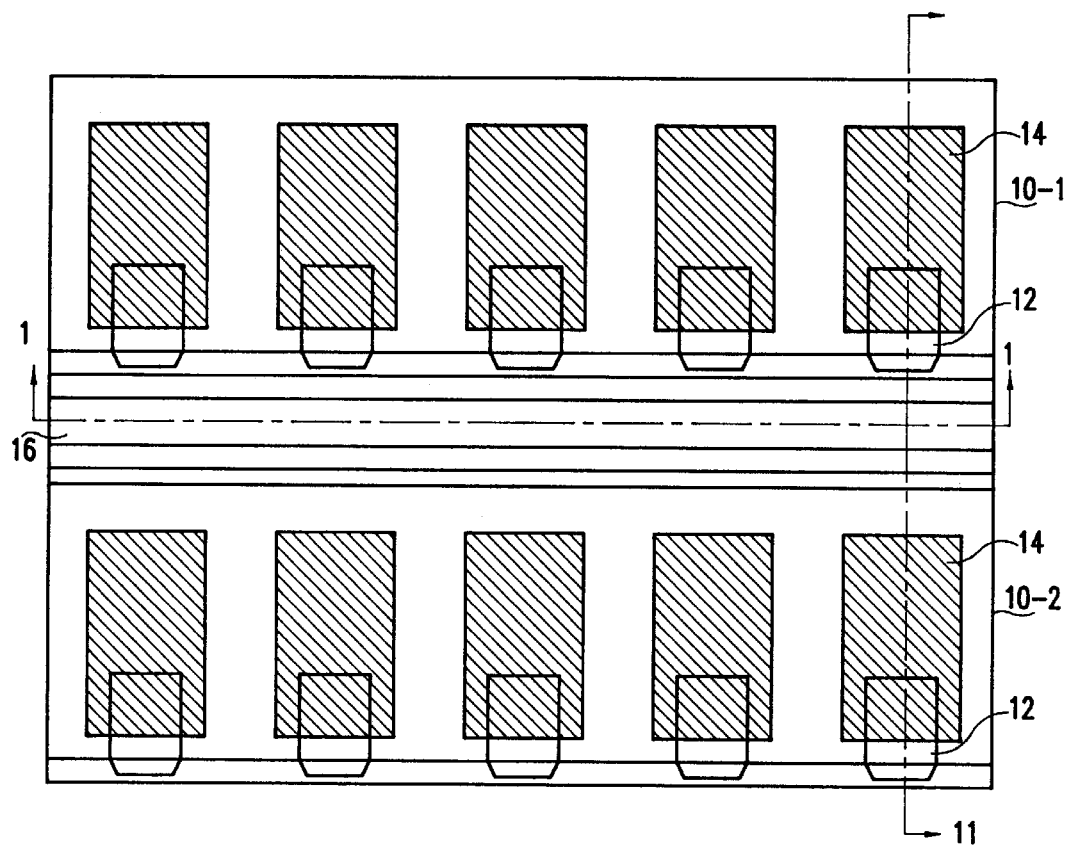
FIG. 2A is a top plan view showing a structure of the end face light emitting type LED arrays according to the first preferred embodiment.
Figure 2B:
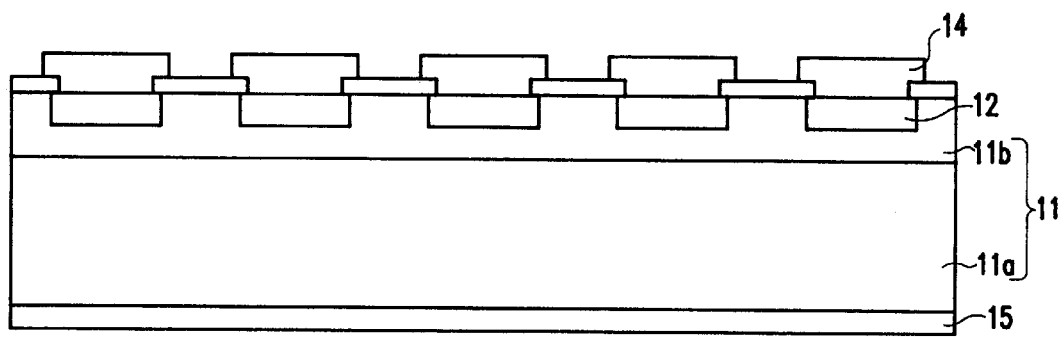
FIG. 2B is a sectional view taken along line I—I in FIG. 2A.
Figure 3:
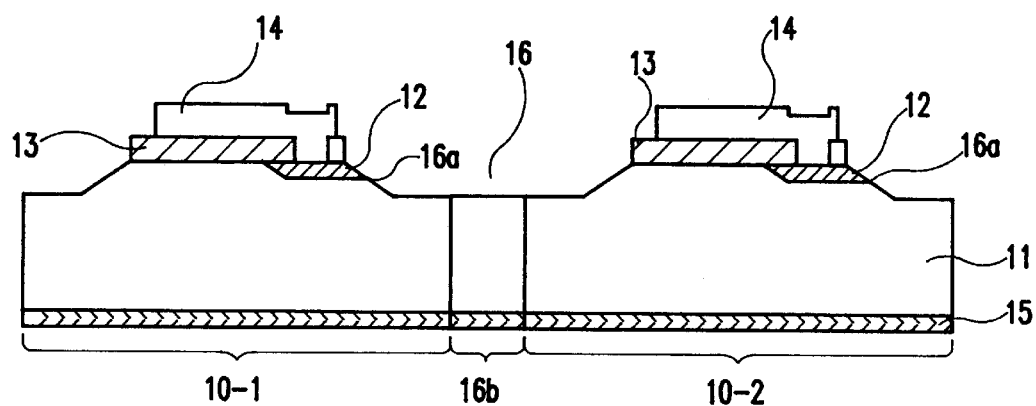
FIG. 3 is a sectional view taken along line II—II in FIG. 2A.

FIG. 2A is a top plan view showing end face light emitting type LED arrays according to the first preferred embodiment of the present invention, FIG. 2B is a sectional view taken along line I—I in FIG. 2A, and FIG. 3 is a sectional view taken along line II—II in FIG. 2A.

In the figures, a semiconductor substrate 11 of a first conductive type (n-type in this embodiment) includes an n-type substrate 11a made of n-type GaAs (gallium.arsenic) and an n-type layer 11b made of n-type GaAsP (gallium.arsenic.phosphorus) and grown on the n-type substrate 11a as an epitaxial layer. In the n-type layer 11b, a plurality of regions 12 of a second conductive type (p-type in this embodiment) made of p-type GaAsP are formed at given intervals corresponding to arranging pitches of LED's. Pn junctions (interfaces) between the p-type regions 12 and the n-type layer 11b become light-emitting portions. As shown in FIG. 3, a first electrode (p-side electrode in this embodiment) 14 is formed on each p-type region 12 via a window of a diffusion prevention film 13, while a second electrode (n-side electrode in this embodiment) 15 is formed on the underside of the n-type substrate 11a.

The diffusion prevention film 13 is necessary upon fabrication and prevents p-type impurities used upon formation of the p-type region 12 from diffusing into regions of the semiconductor substrate 11 other than a given portion thereof. Further, by forming the diffusion prevention film 13 using an insulator film, the semiconductor substrate 11 and the p-side electrode 14 are electrically insulated. An insulator film may further be formed on the diffusion prevention film 13 so as to reduce occurrences of insulation failure.

Further, the diffusion prevention film 13 is used as an etching mask upon formation of a concave portion 16 for forming light-emission end faces 16a. The middle of the concave portion 16 forms a dicing region 16b. By cutting the dicing region 16b, a plurality of (two in this embodiment) end face light emitting type LED arrays 10-1 and 10-2 are produced.

In FIG. 3, the concave portion 16 is tapered downward. This downward tapering is caused due to a crystal orientation of the semiconductor substrate 11 when forming the concave portion 16 through, for example, the wet etching. However, depending on an etching condition of the wet etching or the dry etching, the concave portion 16 may have vertical sides or an upward tapering shape.

In each of the LED arrays 10-1 and 10-2, by applying the forward voltage between the p-side electrodes 14 and the n-side electrodes 15 to allow the current to flow through the pn junctions, the electric energy is directly converted into light which is then emitted through light-emission end faces 16a.

FIG. 1 is a diagram for explaining a method of fabricating the LED arrays 10-1 and 10-2 shown in FIGS. 2A, 2B and 3. Hereinbelow, fabrication processes (1)~(8) thereof according to this embodiment will be described with reference to FIG. 1.

(1) Diffusion Prevention Film and Diffusion Control Film Forming Process ((A) in FIG. 1)

The n-type layer 11b made of n-type GaAsP is grown on the n-type substrate 11a made of n-type GaAs as an epitaxial layer so as to form the n-type semiconductor substrate 11. Using the known film forming technique (for example, vapor deposition, sputtering or CVD (vapor phase epitaxy)), an insulation film made of, for example, alumina, silicon nitride or silicon oxide and having a thickness of about 50~500 nm is formed on the semiconductor substrate 11. Then, the insulation film 13 is selectively removed by using the photolithography and etching techniques so as to form windows which are impurity diffusion scheduled regions 13a and a concave portion forming scheduled region 13b, thus the patterned diffusion prevention film 13 is formed.

On the semiconductor substrate 11 formed thereon with the diffusion prevention film 13, a diffusion control film 21 is formed using the known film forming technique (for example, vapor deposition or sputtering). The diffusion control film 21 is made of, for example, alumina, silicon nitride, silicon oxide or PSG (phospho-silicate glass) and has a thickness of about 10~300 nm.

(2) P-Type Region Forming Process ((B) in FIG. 1)

P-type impurities (for example, zinc (Zn)) are diffused into portions of the semiconductor substrate 11, not covered by the diffusion prevention film 13, via the diffusion control film 21 using the impurity diffusion technique (for example, vapor phase diffusion) so as to form the p-type regions 12 made of p-type GaAsP. Subsequently, the diffusion control film 21 which becomes unnecessary is removed using the known etching technique (for example, wet etching using etching liquid).

(3) P-Side Electrode Forming Process ((C) in FIG. 1)

A film made of a wiring material (for example, aluminum) capable of achieving ohmic contact with the p-type regions 12 is formed all over the diffusion prevention film 13 and the p-type regions 12 using the known film forming technique (for example, vapor deposition). Then, the wiring material film is patterned using the fine-processing technique so as to form the p-side electrodes 14.

(4) Etching Mask Forming Process ((D) in FIG. 1)

For forming the concave portion 16 at a dicing scheduled region between the adjacent LED arrays 10-1 and 10-2, an etching mask film, such as a photoresist, is formed over the whole surface. Then, given portions of the etching mask film are selectively etched by the photolithography so as to form patterned etching mask films 22 for assisting concave portion formation. The etching mask films 22 cover given portions other than the concave portion forming scheduled region, so as to prevent the given portions from being etched upon eaves removing etching in a later process.

(5) Light-Emission End Face Forming Process ((E) in FIG. 1)

The semiconductor substrate 11 is etched using the diffusion prevention film 13 and the etching mask films 22 as masks so as to form the concave portion 16 of a given depth which exceeds the pn junctions between the p-type regions 12 and the n-type layer 11b. The wet etching using citric acid, hydrofluoric acid, sulfuric acid or the like or the dry etching using chlorine gas or the like may be employed to etch the semiconductor substrate 11. By forming the concave portion 16 in this fashion, the light-emission end faces 16a are formed on a side of the concave portion 16.

When the etching speed is isotropic as in the wet etching or the like, the etching advances not only in a depth direction (vertical direction), but also toward the underside of the diffusion prevention film 13 (transverse direction) so that side etching (undercut) portions 16c are produced to form the concave portion 16 into a downward tapering shape. Depending on the etching method or the etching condition, the concave portion 16 may have the vertical sides or an upward tapering shape.

(6) Eaves Portion Removing Process ((F) and (G) in FIG. 1)

When the diffusion prevention film 13 used as a mask for formation of the concave portion is formed with eaves portions 13c due to the side etching portions 16c upon formation of the concave portion, the eaves portions 13c are removed through the wet etching or the like using the etching mask films 22 as masks. Through this process, those portions of the diffusion prevention film 13 which are not covered by the etching mask films 22 are all removed. Thereafter, the etching mask films 22 which become unnecessary are removed through the wet etching or the like using the etching liquid.

(7) N-Side Electrode Forming Process ((H) in FIG. 1)

The n-side electrode 15 of a wiring material, such as gold (Au), is formed on the underside of the semiconductor substrate 11 by means of the vapor deposition or the like. In this case, if the n-side electrode 15 is formed after polishing the underside of the semiconductor substrate 11, the electrical characteristic can be improved.

(8) Dicing Process ((I) in FIG. 1)

After probing the light emission characteristic and the electrical characteristic of each light-emitting diode, the dicing region 16b of the concave portion 16 is cut through the dicing process to separate into the LED arrays 10-1 and 10-2. Thereafter, based on quality determining data of the probing, only good chips are taken out so as to be connected to a drive circuit for producing a printer head or the like.

As described above, the following effects are achieved in the first preferred embodiment:

(i) The diffusion preventing film 13 is used as a mask for forming the p-type regions 12 and further used as a mask for forming the light-emission end faces 16a. Thus, a positional misalignment between the p-type regions 12 and the light-emission end faces 16a in a plan view of FIG. 2A is prevented so that the p-type regions 12 of the uniform size can be formed. Accordingly, even in case of the constant-current driven type LED, it is possible to produce the end face light emitting type LED array 10-1, 10-2 which can achieve the uniform emitted-light quantity.

(ii) Since the diffusion preventing film 13 is used as a mask for forming the p-type regions 12 and further used as a mask for forming the light-emission end faces 16a, it is enough to use the mask only once. Thus, the mask misalignment does not occur so that an area of the p-type region 12 in a transverse direction can be set smaller to increase a current density per unit pn junction area. This makes it possible to achieve a larger emitted-light quantity with a small current.

(iii) The n-side electrode forming process (7) shown at (H) in FIG. 1 can be performed at a desired timing after the p-side electrode forming process (3) shown at (C) in FIG. 1.

[Second Embodiment]

Figure 4H:
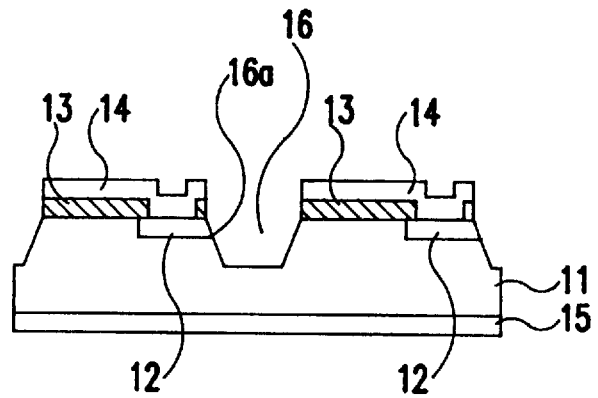
FIG. 4 is a diagram for explaining a method of fabricating end face light emitting type LED arrays according to a second preferred embodiment of the present invention.
Figure 4I:
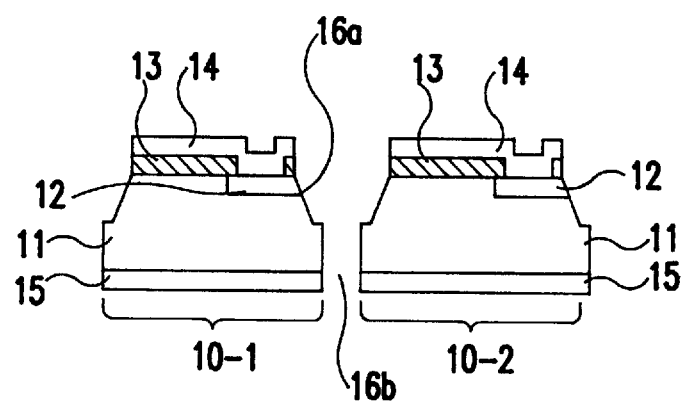
Figure 5A:
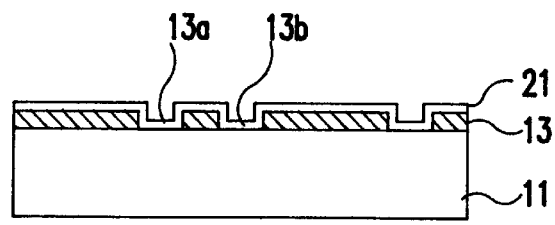
FIG. 5 is a diagram for explaining a method of fabricating end face light emitting type LED arrays according to a third preferred embodiment of the present invention.
Figure 5B:
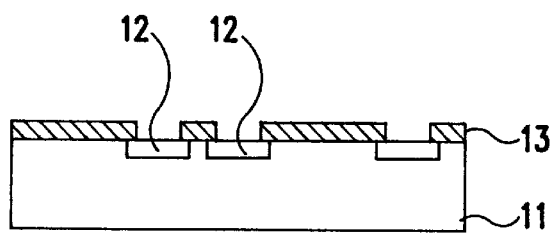
Figure 5C:
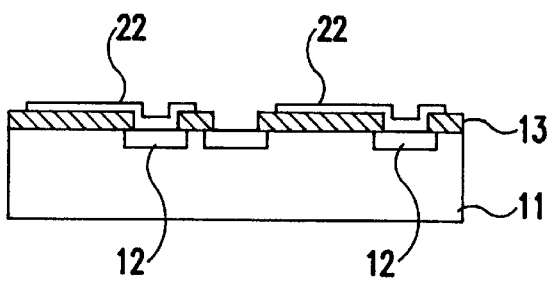
Figure 5D:
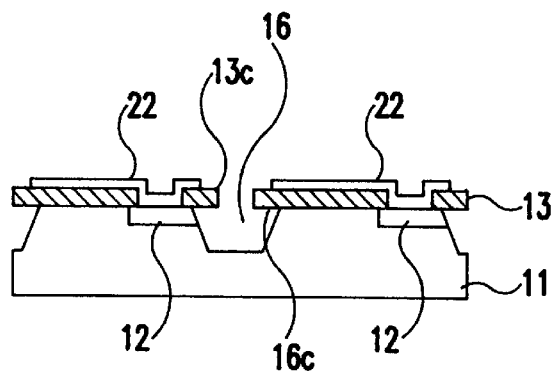
Figure 5E:
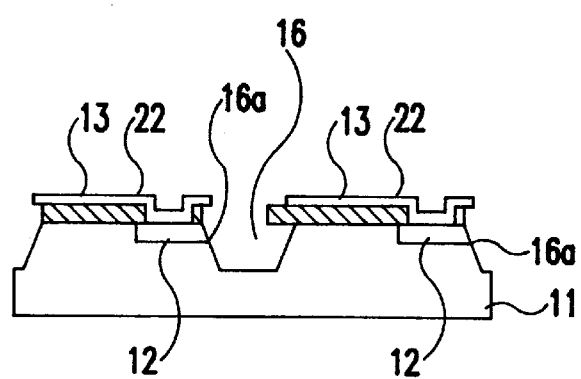
Figure 5F:
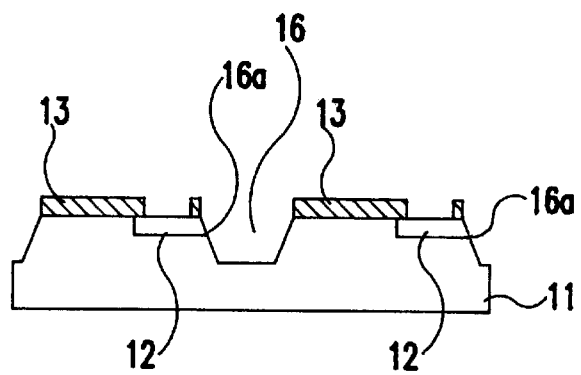
Figure 5G:
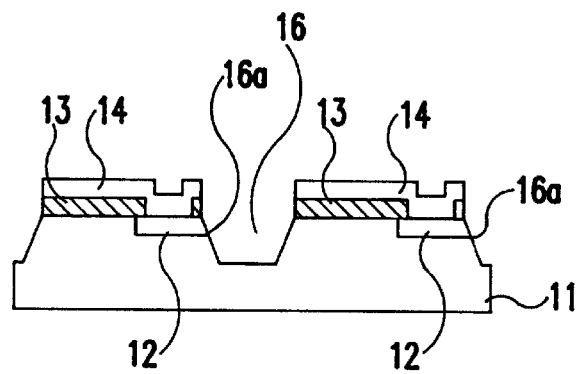
Figure 5H:
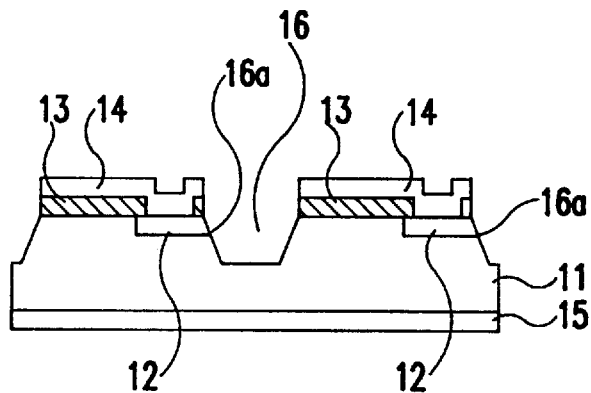
Figure 5I:
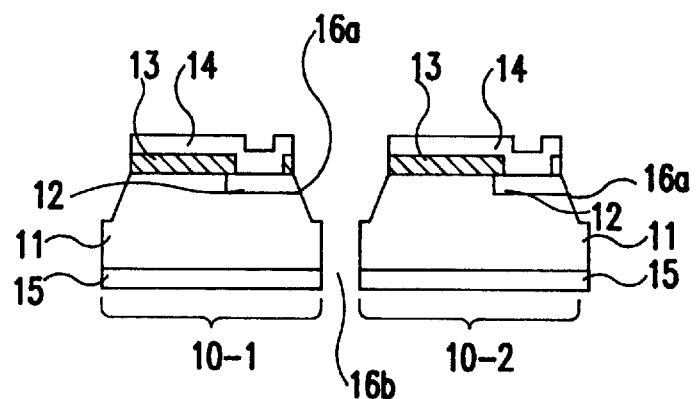

FIG. 4 is a diagram for explaining a method of fabricating the LED arrays 10-1 and 10-2 according to the second preferred embodiment of the present invention. FIG. 4 corresponds to FIG. 1.

In the second preferred embodiment, the etching mask films 22 for assisting concave portion formation are not used. Thus, as shown at (D) and (G) in FIG. 4, the etching mask forming process at (D) in FIG. 1 and the etching mask removing process at (G) in FIG. 1 are omitted in the fabricating method of this embodiment.

The etching mask films 22 are provided for protecting the p-side electrodes 14 during the eaves removing in the eaves portion removing process at (F) in FIG. 1. Accordingly, if the eaves portions 13c of the diffusion prevention film 13 are removed under the condition where the p-side electrodes 14 are prevented from being etched (for example, in the wet etching or the like using etching liquid which does not etch the p-side electrode 14), the process of forming the etching mask films 22 is not necessary. This also renders the corresponding etching mask removing process unnecessary. The other processes are the same as those in the first preferred embodiment.

As described above, in the second preferred embodiment, the following effects are achieved in addition to the foregoing effects (i)~(iii):

(iv) Since the etching mask forming process and the etching mask removing process are omitted as compared with the first preferred embodiment, the fabrication processes can be simplified.

(v) The diffusion control film 21 is provided for preventing occurrence of surface defects of the elements upon formation of the p-type regions 12 by diffusing the impurities. Depending on the impurity diffusion method or the impurity diffusion condition, however, the surface defects can be suppressed to be smaller. In such a case, by omitting the process of forming the diffusion control film 21 and the corresponding removing process therefor at (A) in FIG. 4, the fabrication processes can be further simplified.

[Third Embodiment]

FIG. 5 is a diagram for explaining a method of fabricating the LED arrays 10-1 and 10-2 according to the third preferred embodiment of the present invention. FIG. 5 corresponds to FIG. 1.

In the third preferred embodiment, the p-side and n-side electrodes 14 and 15 are formed after forming the concave portion 16. Hereinbelow, fabrication processes (1)~(8) according to this embodiment will be described with reference to FIG. 5.

(1) Diffusion Prevention Film and Diffusion Control Film Forming Process ((A) in FIG. 5)

Similar to (A) in FIG. 1, the diffusion prevention film 13 and the diffusion control film 21 are formed on the semiconductor substrate 11.

(2) P-Type Region Forming Process ((B) in FIG. 5)

Similar to (B) in FIG. 1, the p-type regions 12 are formed on the semiconductor substrate 11.

(3) Etching Mask Forming Process ((C) in FIG. 5)

On the diffusion prevention film 13, the etching mask films 22 for concave portion forming assistance similar to those at (D) in FIG. 1 are selectively formed so as to cover given portions other than the concave portion forming scheduled region, so as to prevent the given portions from being etched upon eaves removing etching in a later process. The etching mask films 22 are provided for protecting, upon the eaves removing etching in the later process, portions of the diffusion prevention film 13 where the p-side electrodes 14 are formed, and for protecting the p-type regions 12 which form the light-emitting portions. Thus, even if the eaves portions 13c are not removed in the later process, the etching mask films 22 are necessary.

(4) Light-Emission End Face Forming Process ((D) in FIG. 5)

Similar to (E) in FIG. 1, the semiconductor substrate 11 is etched through the wet etching or the dry etching using the diffusion prevention film 13 and the etching mask films 22 as masks, so as to form the concave portion 16 of a given depth. By forming the concave portion 16 in this fashion, the light-emission end faces 16a are formed on a side of the concave portion 16. In this case, the side etching (undercut) portions 16c are produced so that the diffusion prevention film 13 may be formed with the eaves portions 13c.

(5) Eaves Portion Removing Process ((E) and (F) in FIG. 5)

By using the etching mask films 22 as masks, the eaves portions 13c of the diffusion prevention film 13 are removed by the etching. Thereafter, the etching mask films 22 are removed through the dry etching or the like.

(6) P-Side Electrode Forming Process ((G) in FIG. 5)

A film made of a wiring material, such as aluminum, is formed over the whole surface. Then, the wiring material film is patterned using the fine-processing technique so as to form the p-side electrodes 14 connected to the p-type regions 12.

(7) N-Side Electrode Forming Process ((H) in FIG. 5)

As at (H) in FIG. 1, the n-side electrode 15 is formed on the underside of the semiconductor substrate 11.

(8) Dicing Process ((I) in FIG. 5)

Similar to (I) in FIG. 1, the dicing region 16b of the concave portion 16 is cut through the dicing process to separate into the LED arrays 10-1 and 10-2.

As described above, in the third preferred embodiment, the following effects are achieved in addition to the foregoing effects (i) and (ii):

(vi) The n-side electrode forming process at (H) in FIG. 5 can be performed at a desired timing after the etching mask forming process at (C) in FIG. 5.

(vii) As described in the effect (v) in the second preferred embodiment, the diffusion control film 21 does not need to be formed at (A) in FIG. 5. This simplifies the fabrication processes.

While the present invention has been described in terms of the preferred embodiments, the invention is not to be limited thereto, but can be embodied in various ways without departing from the principle of the invention as defined in the appended claims.

For example, the following modification are possible:

(a) If the side etching can be made small enough to be ignored due to the etching condition or the like, the removing process for the eaves portions 13c, which is caused by the side etching, can be omitted. This further simplifies the fabrication processes.

(b) The shape or the structure of the LED arrays 10-1 and 10-2, or the fabricating condition or the materials to be used for the LED arrays 10-1 and 10-2 can be changed from those in the foregoing preferred embodiments.

(c) In FIG. 2B, the pn junction is formed between the lower n-type layer 11b and the upper p-type region (layer) 12. On the other hand, the reversed structure may be possible, for example, the pn junction is formed between the lower p-type layer and the upper n-type region.

(d) The foregoing preferred embodiments each relate to the fabricating method for the LED arrays 10-1 and 10-2. On the other hand, the present invention is also applicable to a fabricating method for an end face light emitting type LED other than the arrayed structure.

What is claimed is:

1. A method of fabricating an end face light emitting type light-emitting diode, comprising:

a light-emitting portion forming process for diffusing an impurity of a second conductive type into a semiconductor substrate of a first conductive type so as to form a region of the second conductive type, and forming a light-emitting portion having a pn junction formed by said second conductive type region and said semiconductor substrate; and an electrode forming process for forming a first electrode on said semiconductor substrate so as to be connected to said second conductive type region, and forming a second electrode on an underside of said semiconductor substrate;

said light-emitting portion forming process comprising:

a diffusion prevention film forming process for forming an insulation film on said semiconductor substrate, and removing an impurity diffusion scheduled region and an adjacent concave portion forming scheduled region from said insulation film so as to form a patterned diffusion prevention film;

a second conductive type region forming process for diffusing said second conductive type impurity into a portion of said semiconductor substrate which is non-covered by said diffusion prevention film, using said diffusion prevention film as a mask, so as to form said second conductive type region; and a light-emission end face forming process for etching said semiconductor substrate through said concave portion forming scheduled region of said diffusion prevention film so as to form a concave portion therein, said concave portion having a depth exceeding said pn junction, and forming a light-emission end face of said light-emitting portion on a side of said concave portion.

2. The method according to claim 1, wherein said first conductive type is an n-type and said second conductive type is a p-type.

3. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a second conductive type region forming process for diffusing an impurity of a second conductive type into a portion of said semiconductor substrate which is non-covered by said diffusion prevention film, using said diffusion prevention film as a mask, so as to form a region of a second conductive type;

a first electrode forming process for forming a first electrode on said diffusion prevention film so as to be connected to said second conductive type region;

a light-emission end face forming process for etching said semiconductor substrate using said diffusion prevention film and said first electrode as masks so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said first electrode as a mask; and a second electrode forming process for forming a second electrode on an underside of said semiconductor substrate in a desired process after said first electrode forming process.

4. The method according to claim 3, wherein said first conductive type is an n-type and said second conductive type is a p-type.

5. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a diffusion control film forming process for forming a diffusion control film which covers said diffusion prevention film, said impurity diffusion scheduled region and said concave portion forming scheduled region;

a second conductive type region forming process for diffusing, through said diffusion control film, an impurity of a second conductive type into a portion of said semiconductor substrate which is non-covered by said diffusion prevention film, using said diffusion prevention film as a mask, so as to form a region of a second conductive type;

a first electrode forming process for forming, after removing said diffusion control film, a first electrode on said diffusion prevention film so as to be connected to said second conductive type region;

a light-emission end face forming process for etching said semiconductor substrate using said diffusion prevention film as a mask so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said first electrode as a mask;

a second electrode forming process for forming a second electrode on an underside of said semiconductor substrate in a desired process after said first electrode forming process; and a dicing process for cutting said concave portion of said semiconductor substrate.

6. The method according to claim 5, wherein said first conductive type is an n-type and said second conductive type is a p-type.

7. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a second conductive type region forming process for diffusing an impurity of a second conductive type into a portion of said semiconductor substrate which is non-covered by said diffusion prevention film, using said diffusion prevention film as a mask, so as to form a region of a second conductive type;

a first electrode forming process for forming a first electrode on said diffusion prevention film so as to be connected to said second conductive type region;

an etching mask forming process for forming an etching mask film on said diffusion prevention film and said first electrode for assisting concave portion formation, said etching mask film covering a portion other than said concave portion forming scheduled region, so as to prevent said portion covered by said etching mask film from being etched upon removing an eaves portion in a later process;

a light-emission end face forming process for etching said semiconductor substrate using said diffusion prevention film and said etching mask film as masks so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said etching mask film as a mask, and then removing said etching mask film;

a second electrode forming process for forming a second electrode on an underside of said semiconductor substrate in a desired process after said first electrode forming process; and a dicing process for cutting said concave portion of said semiconductor substrate.

8. The method according to claim 7, wherein said first conductive type is an n-type and said second conductive type is a p-type.

9. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a diffusion control film forming process for forming a diffusion control film which covers said diffusion prevention film, said impurity diffusion scheduled region and said concave portion forming scheduled region;

a second conductive type region forming process for diffusing, through said diffusion control film, an impurity of a second conductive type into a portion of said semiconductor substrate which is non-covered by said diffusion prevention film, using said diffusion prevention film as a mask, so as to form a region of a second conductive type;

a first electrode forming process for forming, after removing said diffusion control film, a first electrode on said diffusion prevention film so as to be connected to said second conductive type region;

an etching mask forming process for forming an etching mask film on said diffusion prevention film and said first electrode for assisting concave portion formation, said etching mask film covering a portion other than said concave portion forming scheduled region, so as to prevent said portion covered by said etching mask film from being etched upon removing an eaves portion in a later process;

a light-emission end face forming process for etching said semiconductor substrate using said diffusion prevention film and said etching mask film as masks so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said etching mask film as a mask, and then removing said etching mask film;

a second electrode forming process for forming a second electrode on an underside of said semiconductor substrate in a desired process after said first electrode forming process; and a dicing process for cutting said concave portion of said semiconductor substrate.

10. The method according to claim 9, wherein said first conductive type is an n-type and said second conductive type is a p-type.

11. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a second conductive type region forming process for diffusing an impurity of a second conductive type into a portion of said semiconductor substrate which is non-covered by said diffusion prevention film, using said diffusion prevention film as a mask, so as to form a region of a second conductive type;

an etching mask forming process for forming an etching mask film on said diffusion prevention film for assisting concave portion formation, said etching mask film covering a portion other than said concave portion forming scheduled region, so as to prevent said portion covered by said etching mask film from being etched upon removing an eaves portion in a later process;

a light-emission end face forming process for etching said semiconductor substrate using said diffusion prevention film and said etching mask film as masks so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said etching mask film as a mask, and then removing said etching mask film;

a first electrode forming process for forming a first electrode on said diffusion prevention film so as to be connected to said second conductive type region;

a second electrode forming process for forming a second electrode on an underside of said semiconductor substrate in a desired process after said etching mask forming process; and a dicing process for cutting said concave portion of said semiconductor substrate.

12. The method according to claim 11, wherein said first conductive type is an n-type and said second conductive type is a p-type.

13. A method of fabricating an end face light emitting type light-emitting diode, comprising:

a diffusion prevention film forming process for forming an insulation film on a semiconductor substrate of a first conductive type, and removing an impurity diffusion scheduled region and an adjacent concave portion forming scheduled region from said insulation film so as to form a patterned diffusion prevention film;

a diffusion control film forming process for forming a diffusion control film which covers said diffusion prevention film, said impurity diffusion scheduled region and said concave portion forming scheduled region;

a second conductive type region forming process for diffusing, through said diffusion control film, an impurity of a second conductive type into a portion of said semiconductor substrate which is non-covered by said diffusion prevention film, using said diffusion prevention film as a mask, so as to form a region of a second conductive type;

an etching mask forming process for forming an etching mask film on said diffusion prevention film for assisting concave portion formation, said etching mask film covering a portion other than said concave portion forming scheduled region, so as to prevent said portion covered by said etching mask film from being etched upon removing an eaves portion in a later process;

a light-emission end face forming process for etching said semiconductor substrate using said diffusion prevention film and said etching mask film as masks so as to form a concave portion therein, said concave portion having a depth exceeding a pn junction formed by said second conductive type region and said semiconductor substrate, and forming a light-emission end face of said pn junction on a side of said concave portion;

an eaves portion removing process for removing an eaves portion of said diffusion prevention film by etching, using said etching mask film as a mask, and then removing said etching mask film;

a first electrode forming process for forming a first electrode on said diffusion prevention film so as to be connected to said second conductive type region;

a second electrode forming process for forming a second electrode on an underside of said semiconductor substrate in a desired process after said etching mask forming process; and a dicing process for cutting said concave portion of said semiconductor substrate.

14. The method according to claim 13, wherein said first conductive type is an n-type and said second conductive type is a p-type.

* * * * *